United States Patent
Huang et al.

(10) Patent No.: US 10,388,765 B2
(45) Date of Patent: Aug. 20, 2019

(54) METHOD OF FORMING GATE-ALL-AROUND STRUCTURES

(71) Applicant: SHANGHAI IC R&D CENTER CO., LTD., Shanghai (CN)

(72) Inventors: Rendong Huang, Shanghai (CN); Min Zhong, Shanghai (CN)

(73) Assignee: SHANGHAI IC R&D CENTER CO., LTD, Shanghai (CN)

(*) Notice: Subject to any disclaimer, the term of this patent is extended or adjusted under 35 U.S.C. 154(b) by 47 days.

(21) Appl. No.: 15/765,490

(22) PCT Filed: May 17, 2016

(86) PCT No.: PCT/CN2016/082308
§ 371 (c)(1),
(2) Date: Apr. 2, 2018

(87) PCT Pub. No.: WO2017/071181
PCT Pub. Date: May 4, 2017

(65) Prior Publication Data
US 2018/0294345 A1    Oct. 11, 2018

(30) Foreign Application Priority Data
Oct. 26, 2015    (CN) .......................... 2015 1 0703584

(51) Int. Cl.
*H01L 21/28* (2006.01)
*H01L 29/66* (2006.01)
*H01L 29/78* (2006.01)
*H01L 21/762* (2006.01)
*H01L 21/768* (2006.01)
*H01L 29/423* (2006.01)

(52) U.S. Cl.
CPC ........ *H01L 29/66795* (2013.01); *H01L 21/28* (2013.01); *H01L 21/762* (2013.01); *H01L 21/76865* (2013.01); *H01L 29/42356* (2013.01); *H01L 29/42392* (2013.01); *H01L 29/7855* (2013.01)

(58) Field of Classification Search
CPC ................. H01L 29/42392; H01L 21/823437
See application file for complete search history.

(56) References Cited

FOREIGN PATENT DOCUMENTS

TW    200919587    *   5/2009    ......... H01L 29/0634

* cited by examiner

*Primary Examiner* — Farun Lu
(74) *Attorney, Agent, or Firm* — Tianchen LLC.

(57) ABSTRACT

A manufacturing method for gate-all-around structures in semiconductor IC manufacturing field includes forming a buried gate layer on the semiconductor substrate, forming an epitaxial layer in non-buried-gate-layer regions and planarizing the epitaxial layer so that the top surface of the epitaxial layer is at the same level with the top surface of the buried gate layer; forming a fin structure on the buried gate layer; forming a gate structure traversing and surrounding the fin structure. Since the gate structure wraps around four sides of the fin to effectively control the channel, the channel width is increased compared with the double-gate or triple gate structure, thereby increasing the effective area of the channel. The present invention solves the conventional problems like complex process and high cost without degrading the device performance. It has the advantages of simplicity, compatibility with the traditional IC planar process, low cost, and easy implementation.

10 Claims, 8 Drawing Sheets

METHOD OF FORMING GATE-ALL-AROUND STRUCTURES

CROSS-REFERENCE TO RELATED APPLICATION

This application claims the priority benefit of International Patent Application Serial No. PCT/CN2016/082308, filed May. 17, 2016, which is related to and claims the priority benefit of China patent application serial No. 201510703584.3, filed Oct. 26, 2015. The entirety of each of the above-mentioned patent applications is hereby incorporated by reference herein and made a part of this specification.

FIELD OF THE INVENTION

The present invention generally relates to the field of semiconductor integrated circuit manufacturing technology, and more particularly, to a method of forming gate-all-around structures.

BACKGROUND OF THE INVENTION

The semiconductor integrated circuit industry has experienced rapid development in the past years. With the development of the IC technology, integrated circuits are manufactured with higher functional density (numbers of devices in each chip) and smaller size (the minimum dimensions of the devices that can be manufactured by the manufacturing process). Although such scaling down of device dimensions enhances productivity and reduces production cost, it also increases manufacturing and processing complexity.

As technology advances to the nano-node, some manufacturers are making a transition to FinFETs from planar devices, in order to achieve higher device density, better device performance and lower cost. Compared with the planar device, the FinFET has suppressed short channel effect due to the good control over the channel.

The FinFET technology has been developed by resolving various manufacturing and design challenges. Currently, the FinFET technology has been applied in the 20 nm technology node. Although the FinFET devices and their manufacturing method have basically achieved expected results, they are not fully satisfactory in all aspects.

The FinFET is a multi-gate MOSFET. According to the number of gates, the FinFET can be classified into double-gate FinFET, triple-gate FinFET, and gate-all-around FinFET in which the gates are placed on all four sides of the fin.

The double-gate FinFET has two gates respectively placed on two opposing sides of the fin to separately control the channel current. In the actual application, the double-gate FinFET is used in the core logical circuit which requires low current leakage.

The triple-gate FinFET has three gates, two placed on two opposing sides of the fin and one placed on the top surface of the fin. The gates are isolated from the fin through an underlying insulating layer below the gates, the fin is isolated from the substrate though another insulating layer below the fin. The fin structure of the triple-gate FinFET can be formed on the SOI substrate or the bulk silicon substrate. Since the three sides of the fin are all controlled by the gates, carriers in the active regions can be controlled better compared with the conventional MOSFET, driving current can be increased, thereby improving the device performance. Nowadays, the FinFETs applied widely in the industry are mainly triple-gate FinFETs.

With the increasing demand for device performance, the gate-all-around FinFET which enables gate control over four sides is developed. The gate-all-around FinFET can effectively increase gate control ability and suppress the short channel effect.

The gate-all-around FinFET generally has a suspended gate structure. The manufacturing method of the gate-all-around FinFET is as follows:

Firstly, forming active regions by a planar process; then, removing the lower portion of the active regions to form a suspended gate region; afterwards, forming a gate dielectric layer; and finally, depositing polysilicon to form the control gates.

The gate-all-around FinFET may also have a vertical-type gate structure in which the active regions are vertical to the substrate surface. However, such structure is more complicated in manufacturing.

From above, the conventional manufacturing process for gate-all-around FinFETs is very complicated and costly, which limits the rapid development of FinFET devices with low cost and high productivity. Accordingly, how to provide a simple, reliable, low-cost manufacturing method to form gate-all-around FinFETs with high performance is a problem to be resolved by those skilled in the art.

BRIEF SUMMARY OF THE DISCLOSURE

Accordingly, an objective of the present invention is to provide a simple, reliable, low-cost method of forming gate-all-around structure with high performance and gate control ability over four sides. The method is easy in process and compatible to the conventional integrated circuit planar technology, thereby solving the problems of process complexity and high cost.

In order to solve the above technical problem, the present invention provides a method of forming gate-all-around structures for FinFET devices including the following steps:

S01, providing a semiconductor substrate; forming a composite layer on the semiconductor substrate and patterning the composite layer; wherein, the composite layer comprises a dielectric layer, a buried gate layer and a barrier layer from bottom to top;

S02, forming a sidewall layer on four sides of the patterned composite layer, then forming an epitaxial layer surrounding the sidewall layer; planarizing the epitaxial layer so that a top surface of the barrier layer, a top surface of the sidewall layer and a top surface of the epitaxial layer are at the same level;

S03, removing the barrier layer; depositing a first high-k dielectric layer having the same thickness with the barrier layer;

S04, forming a fin layer; patterning the fin layer to expose the buried gate layer, so as to form a fin structure;

S05, forming a dielectric isolating layer on the epitaxial layer;

S06, forming a second high-k dielectric layer on sidewalls and a top surface of the fin structure;

S07, forming a second gate layer, patterning the second gate layer to form a gate structure traversing and surrounding the fin structure.

Preferably, the step S03 comprises the following steps:

S031, removing the barrier layer by wet etching or dry etching;

S032, depositing the first high-k dielectric layer having the same thickness with the barrier layer;

S033, removing the first high-k dielectric layer on the sidewall layer and the epitaxial layer.

Preferably, the step S07 comprises the following steps:

S071, forming a second gate layer, the second gate layer covers the fin structure;

S072, planarizing the second gate layer;

S073, etching the second gate layer by lithography and etching processes to form the gate structure.

Preferably, the buried gate layer is connected with the second gate layer to wrap the fin structure.

Preferably, in the step S04, the fin layer is formed by a bonding process; the material of the fin layer is the same as the material of the semiconductor substrate.

Preferably, the material of the buried gate layer and the second gate layer is doped polysilicon.

Preferably, in the step S01, the dielectric layer is silicon oxide, silicon nitride, or silicon oxynitride; the barrier layer is silicon nitride or silicon carbon nitride.

Preferably, in the step S02, the material of the epitaxial layer is the same as the material of the semiconductor substrate.

Preferably, the material of the first high-k dielectric layer and the second high-k dielectric layer is hafnium oxide.

Preferably, the fin structure in horizontal projection has a bar shape, a stripe shape or a rectangular shape.

Compared with the conventional method, the present invention provides a manufacturing method for gate-all-around structures which includes forming a buried gate layer on the semiconductor substrate; then forming an epitaxial layer in non-buried-gate-layer regions and planarizing the epitaxial layer so that the top surface of the epitaxial layer is at the same level with the top surface of the buried gate layer; forming a fin structure on the buried gate layer; forming a gate structure traversing and surrounding the fin structure. Since the gate structure wraps around four sides of the fin to effectively control the channel, the channel width is increased compared with the double-gate or triple gate structure, thereby increasing the effective area of the channel. The present invention solves the conventional problems like complex process and high cost without degrading the device performance. It has the advantages of simplicity, compatibility with the traditional integrated circuit planar process, low cost, and easy implementation.

BRIEF DESCRIPTION OF THE DRAWINGS

In order that technical solutions of the present invention may be more fully understood, the embodiments of the present invention will now be described in detail hereafter with reference to the accompanying drawings. Notably, the drawings are substantially used for illustrating the embodiments of the invention and should not be used as limitation to.

DETAILED DESCRIPTION OF THE EMBODIMENTS

In order that objects, characteristics, and advantages of the present invention may be more fully understood, the embodiments of the present invention will now be described in detail hereafter with reference to the accompanying drawings. It should be appreciated by those skilled in the art that the specific embodiments disclosed might be readily utilized as a basis for modifying or designing other structures or processes for carrying out the purposes of the present invention. It should also be realized by those skilled in the art that such equivalent constructions and variations on the example embodiments described do not depart from the spirit of the invention.

Figure 1:
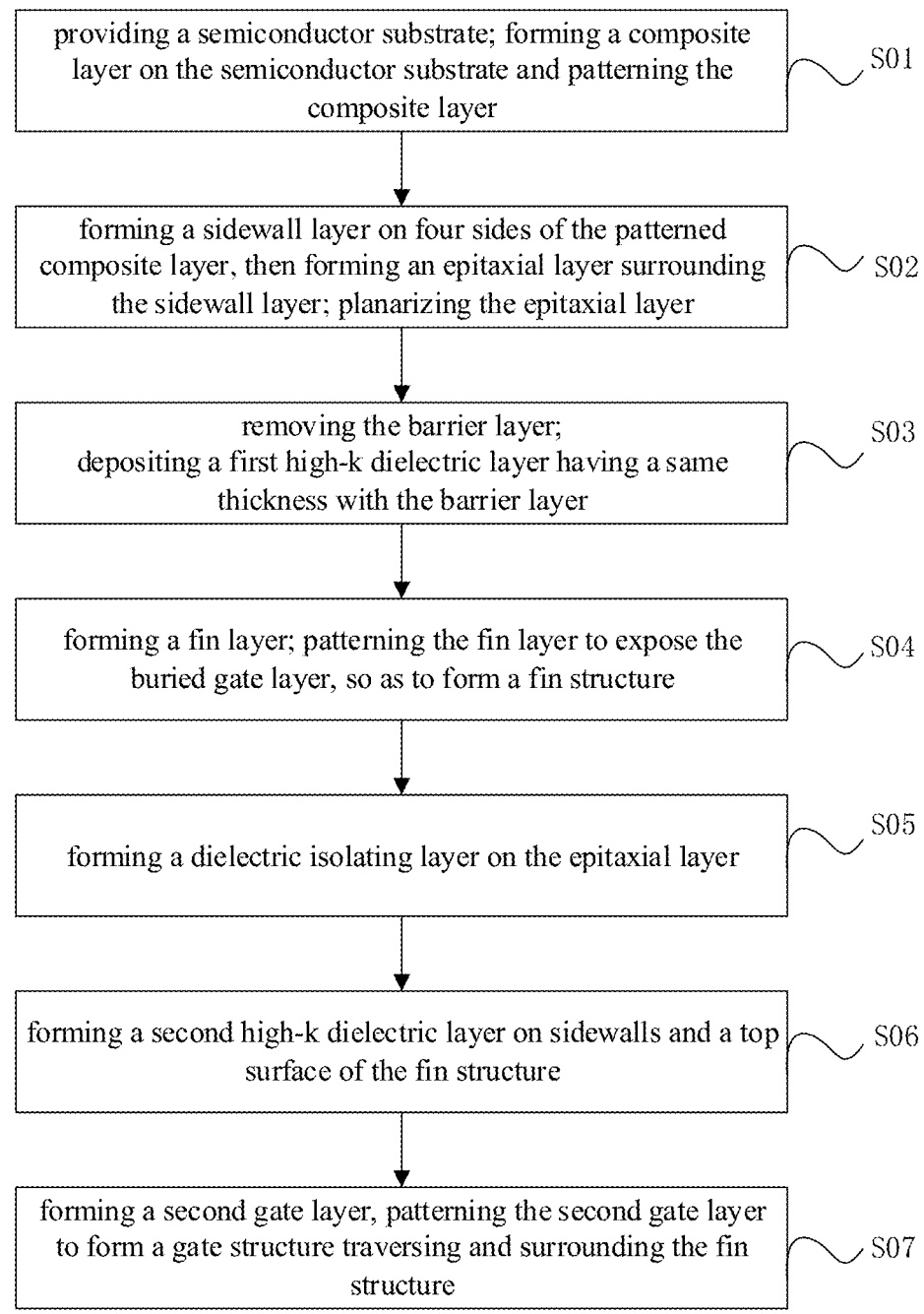
FIG. 1 is a flow chart for illustrating a method of forming gate-all-around structures according to the present invention.
Figure 4:
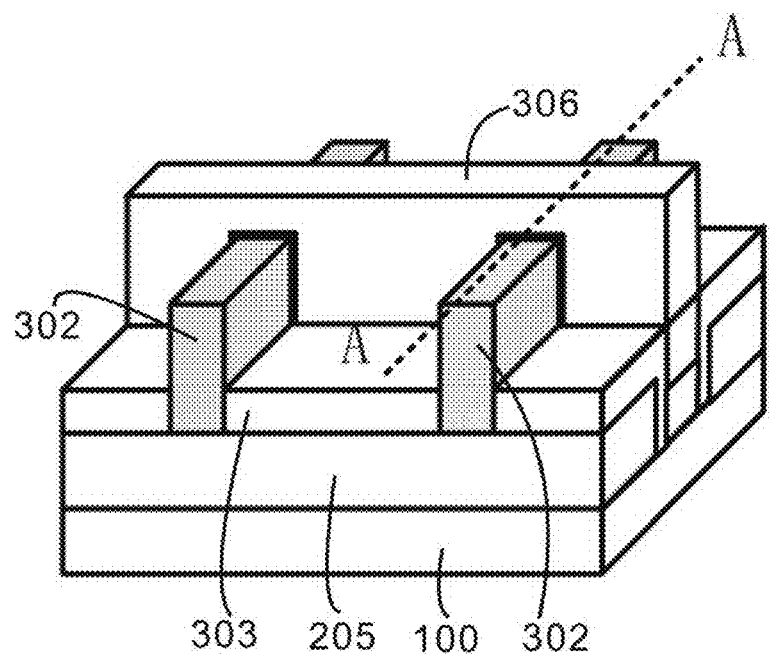
FIG. 4 is a perspective view of the gate-all-around structure.
Figure 5:
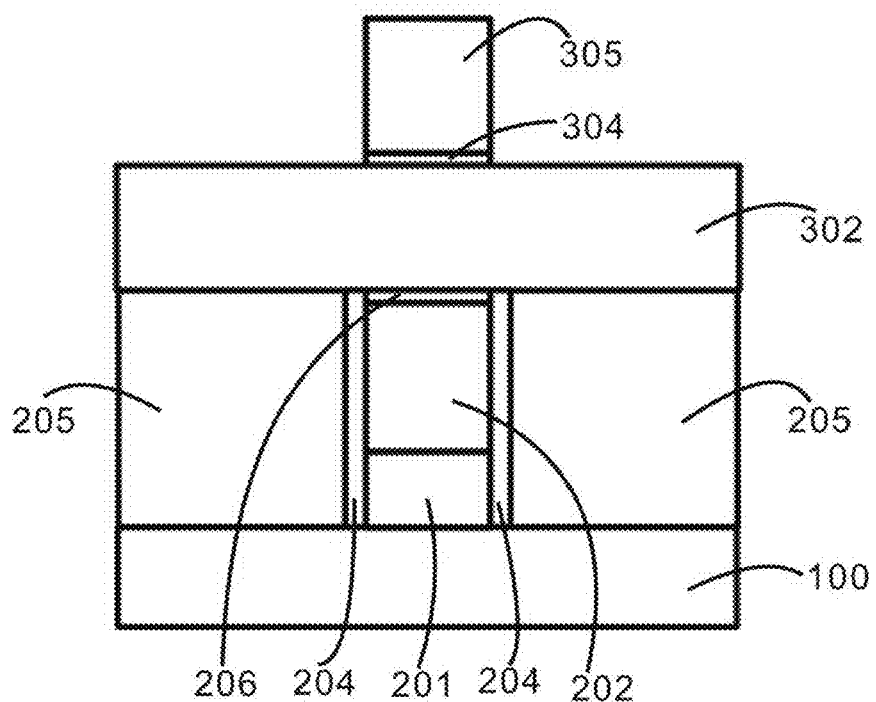
FIG. 5 is a sectional view of the gate-all-around structure.

Above and additional features and advantages of embodiments of the invention will be described hereinafter. FIG. 1 is a flow chart for illustrating a method of forming gate-all-around structure according to the present invention; FIG. 2a-2j are side views of the gate-all-around structure; FIG. 3a-3j are top views of the gate-all-around structure; FIG. 4 is a perspective view of the gate-all-around structure; FIG. 5 is a sectional view of the gate-all-around structure.

As shown in FIG. 1, the present invention provides a method of forming gate-all-around structure for the FinFET devices, comprising:

Step S01, providing a semiconductor substrate 100, forming a composite layer on the semiconductor substrate 100, and patterning the composite layer. Wherein, the composite layer comprises a dielectric layer 201, a buried gate layer 202, and a barrier layer 203 (see FIG. 2a and FIG. 3a), from bottom to top.

Specifically, the semiconductor substrate 100 can be any conventional substrate in the art like bulk silicon substrate, SOI substrate, silicon germanium substrate, or GaAS substrate. The composite layer can be formed and patterned by any conventional method. Preferably, the composite layer is etched by lithography and etching processes. Preferably, the dielectric layer 201 is silicon oxide, silicon nitride, or silicon oxynitride; the barrier layer 203 is silicon nitride or silicon carbon nitride; the buried gate layer 202 is doped polysilicon Step S02, forming a sidewall layer 204 on four sides of the patterned composite layer, then then forming an epitaxial layer 205 surrounding the sidewall layer; planarizing the epitaxial layer 205 so that a top surface of the barrier layer 203, a top surface of the sidewall layer 204 and a top surface of the epitaxial layer 205 are in the same level (see FIG. 2b-FIG. 2c, FIG. 3b-FIG. 3c).

Specifically, the sidewall layer 204 can be formed by an epitaxial process. Preferably, the sidewall layer 204 is a pure silicon layer or a doped silicon layer. Then, the epitaxial layer 205 is formed surrounding the sidewall layer 204. The material of the epitaxial layer 205 is preferably as same as the material of the semiconductor substrate 100.

Step S03, removing the barrier layer 203, depositing a first high-k dielectric layer 206 having the same thickness with the barrier layer (see FIG. 2d-FIG. 2e, FIG. 3d-FIG. 3e).

Specifically, the step S03 comprises the following steps: S031, removing the barrier layer 203 by wet etching or dry etching; S032, depositing the first high-k dielectric layer 206 having the same thickness with the barrier layer 203; S033, removing the first high-k dielectric layer 206 on the sidewall layer 204 and the epitaxial layer 205. Preferably, the material of the first high-k dielectric layer is hafnium oxide.

Step S04, forming a fin layer 301, patterning the fin layer 301 to expose the buried gate layer 202, so as to form a fin structure 303 (see FIG. 2f-FIG. 2g, FIG. 3f-FIG. 3g).

Specifically, the fin layer 301 is preferred to be formed by a bonding process. The material of the fin layer 301 is the same with the material of the semiconductor substrate 100. Then, the fin layer 301 and the first high-k dielectric layer 206 are patterned by lithography and etching processes to expose the buried gate layer 202. Afterwards, the sidewall layer 204 and the epitaxial layer 205 outside the patterned first high-k dielectric layer is removed.

Figure 2A:
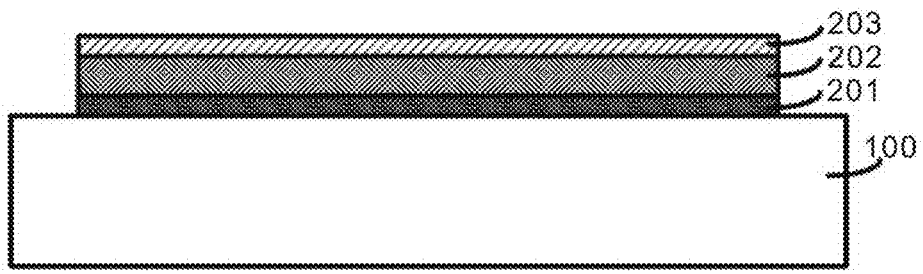
FIG. 2a-2j are side views of the gate-all-around structure.
Figure 2B:
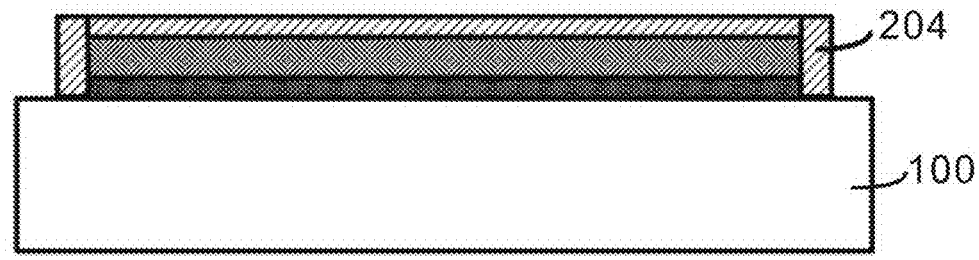
Figure 2C:
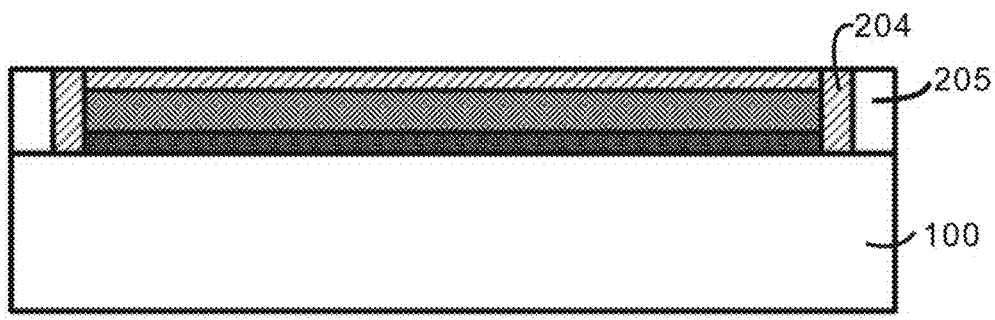
Figure 2D:
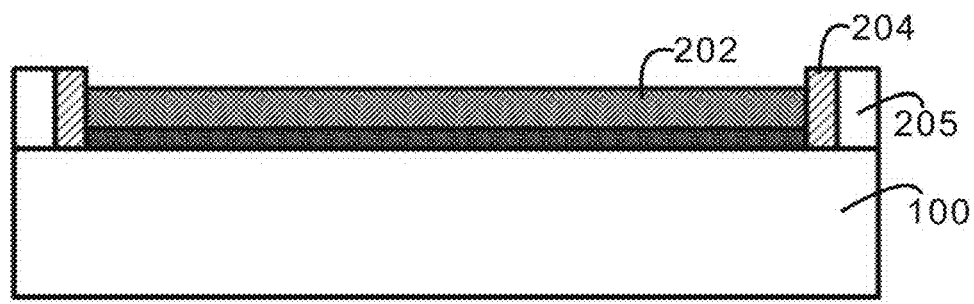
Figure 2E:
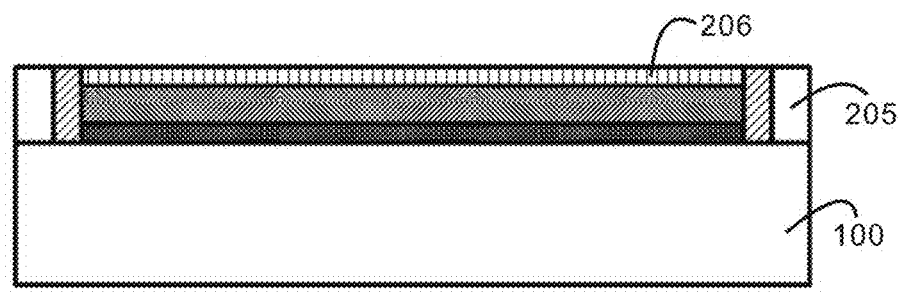
Figure 2F:
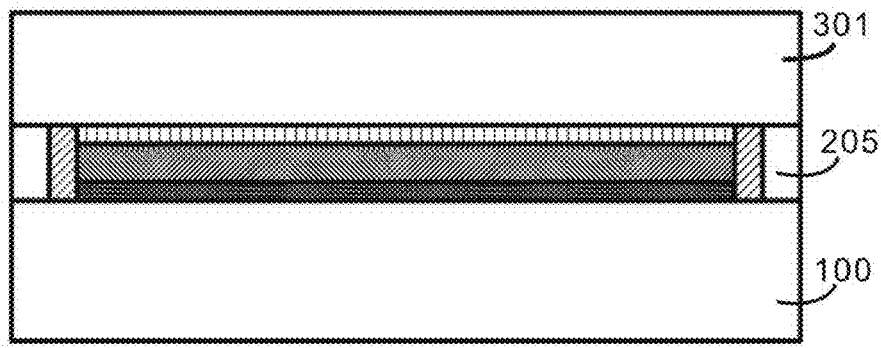
Figure 2G:
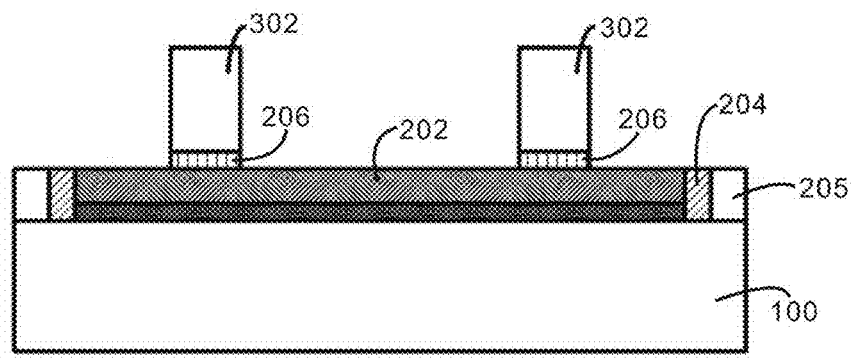
Figure 2H:
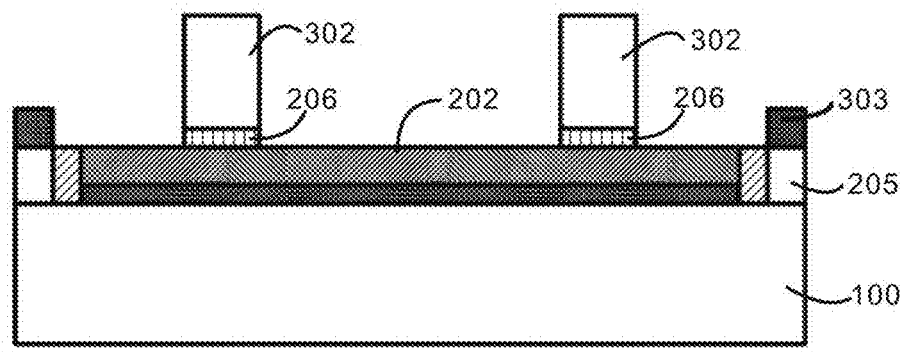
Figure 3A:
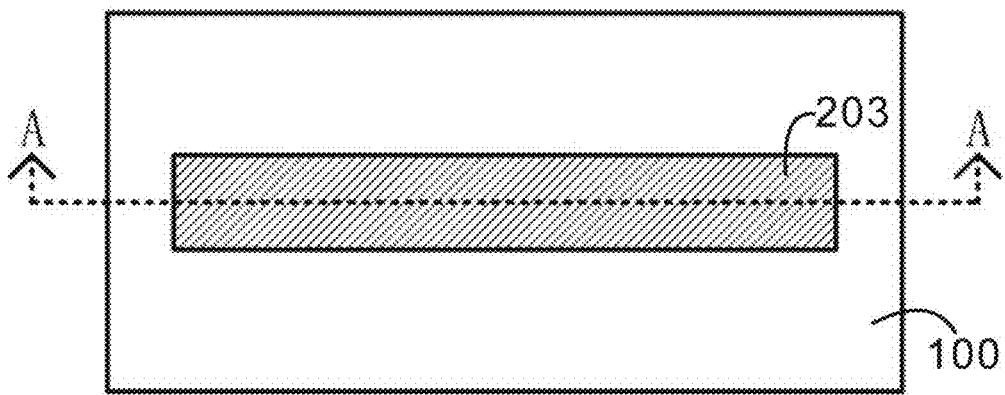
FIG. 3a-3j are top views of the gate-all-around structure.
Figure 3B:
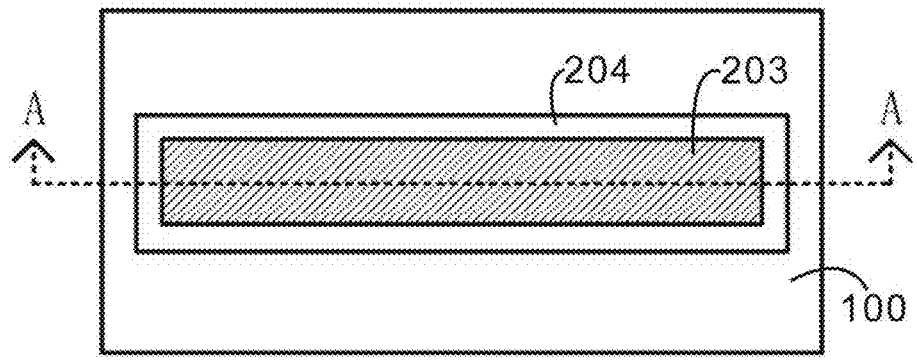
Figure 3C:
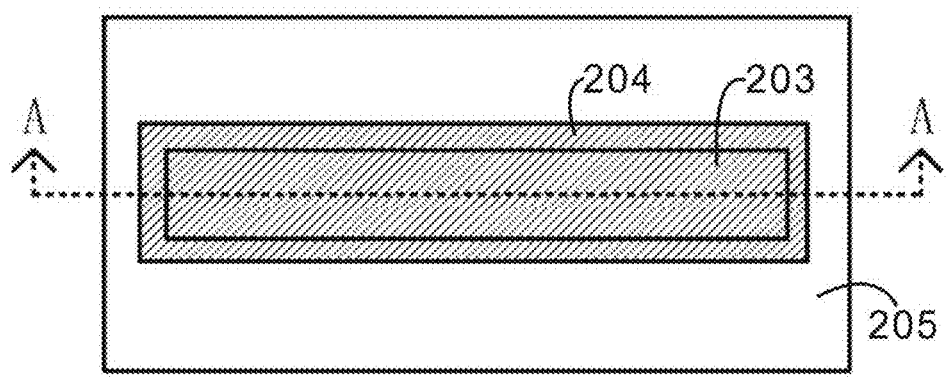
Figure 3D:
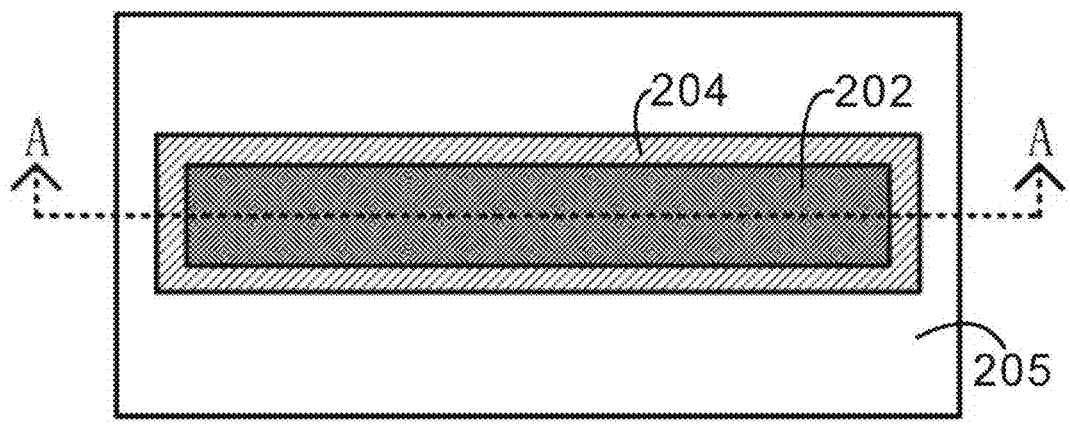
Figure 3E:
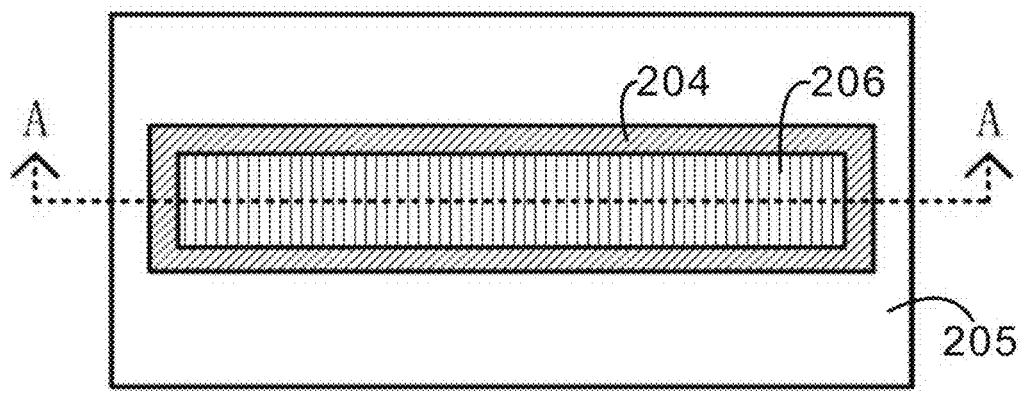
Figure 3F:
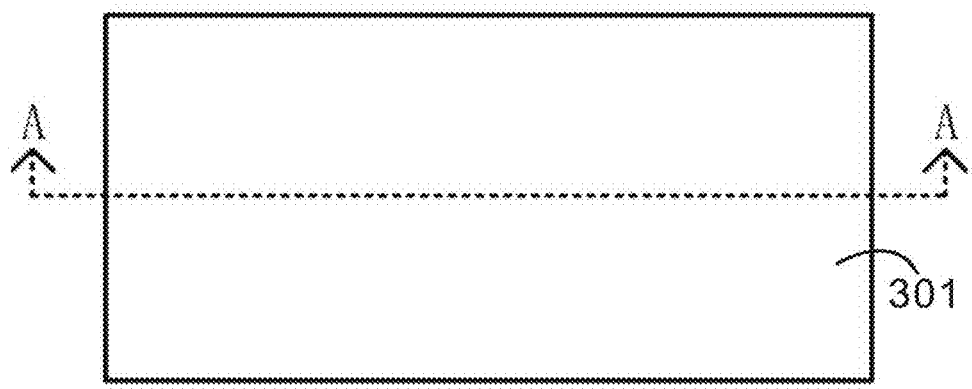
Figure 3G:
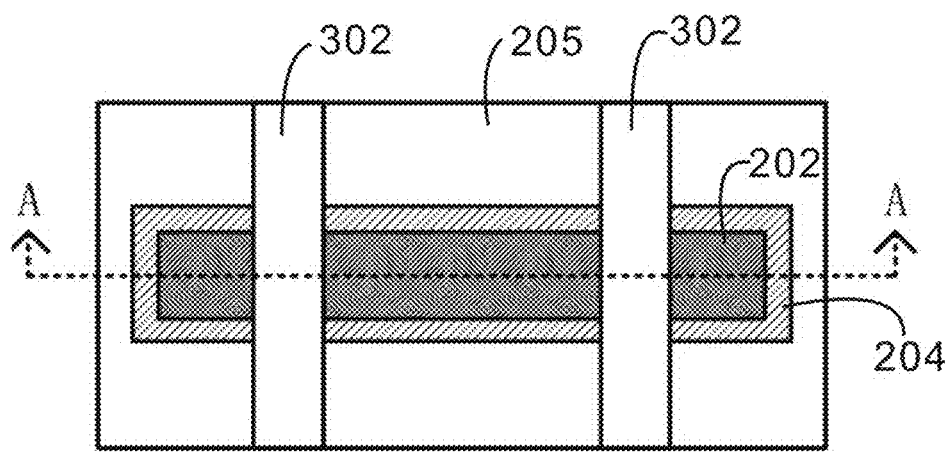
Figure 3H:
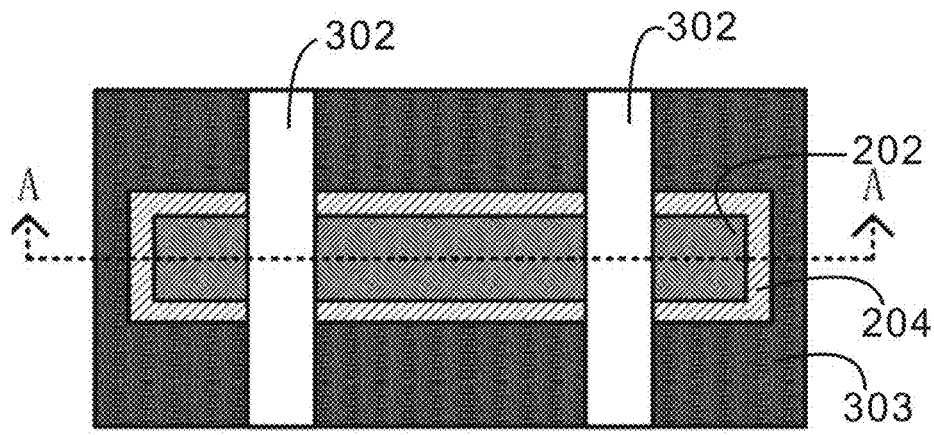

Step S05, forming a dielectric isolating layer 303 on the epitaxial layer 205 (see FIG. 2h and FIG. 3h).

Specifically, the dielectric isolating layer 303 can be formed by any conventional method, to isolate the gate structure to be formed later and the semiconductor substrate.

Figure 2I:
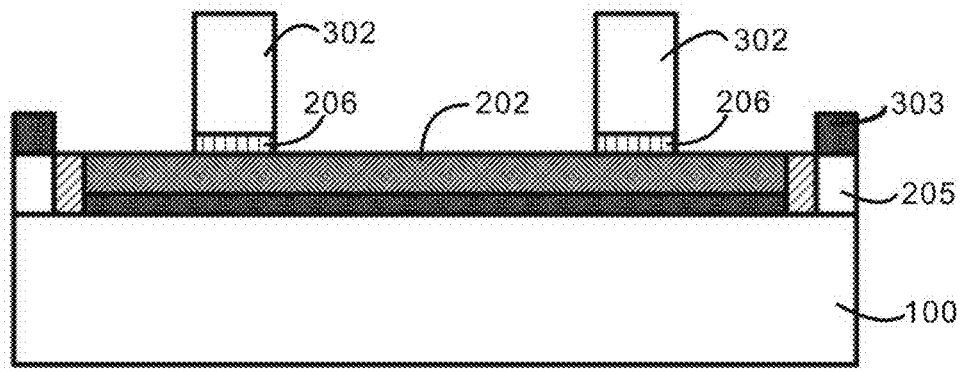
Figure 3I:
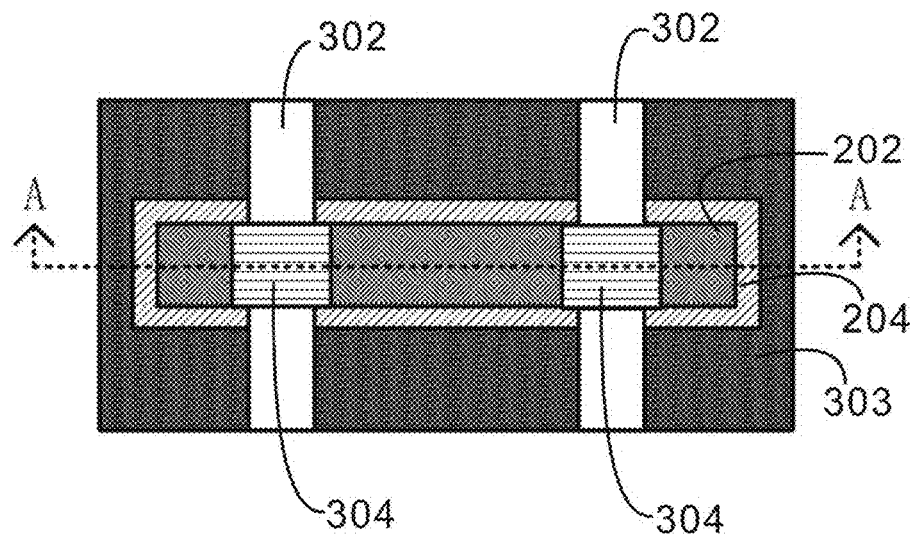

Step S06, forming a second high-k dielectric layer 304 on the sidewall and top surface of the fin structure 302 (see FIG. 2i and FIG. 3i).

Specifically, the second high-k dielectric layer 304 is deposited on the above formed structure. Then, the second high-k dielectric layer 304 outside the fin structure 302 is removed. That is, only the second high-k dielectric layer 304 presented on the sidewall and top surface of the fin structure 302 is remained. Preferably, the material of the second high-k dielectric layer 304 is hafnium oxide.

Figure 2J:
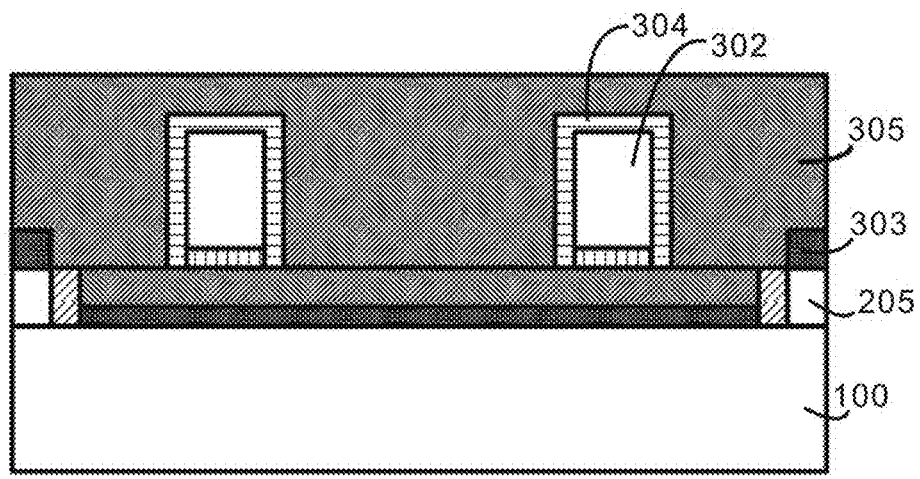
Figure 3J:
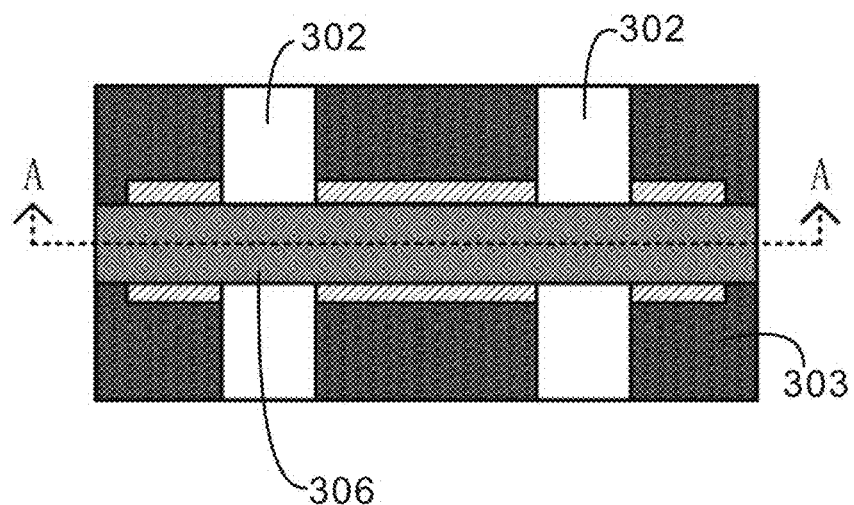

Step S07, forming a second gate layer 305, patterning the second gate layer 305 to form a gate structure 306 traversing and surrounding the fin structure 306 (see FIG. 2j and FIG. 3j).

Specifically, the step S07 comprises the following steps: S071, forming the second gate layer 305, the second gate layer 305 covers the fin structure 302; S072, planarizing the second gate layer 305; S073, etching the second gate layer 305 by lithography and etching processes to form the gate structure 306. Preferably, the material of the second gate layer 305 is doped polysilicon.

As shown in FIG. 4 and FIG. 5, the buried gate layer 202 is connected with the second gate layer 305 to wrap the fin structure 302. The fin structure 302 in horizontal projection can have a bar shape, stripe shape or rectangular shape. Such structure increases the width of the channel and enlarges the effective area of the channel.

In summary, the present invention provides a manufacturing method for gate-all-around structures which includes forming a buried gate layer 202 on the semiconductor substrate 100; then forming an epitaxial layer 205 in non-buried-gate-layer regions and planarizing the epitaxial layer 205 so that the top surface of the epitaxial layer is at the same level with the top surface of the buried gate layer 202; forming the fin structure 306 on the buried gate layer; forming the gate structure traversing and surrounding the fin structure. Since the gate structure wraps around four sides of the fin to effectively control the channel, the channel width is increased compared with the double-gate or triple gate structure, thereby increasing the effective area of the channel. The present invention solves the conventional problems like complex process, high cost without degrading the device performance. It has the advantages like simplicity, compatibility with the traditional integrated circuit planar process, low cost, and easy implementation.

While this invention has been particularly shown and described with references to preferred embodiments thereof. This invention may, however, be embodied in different forms and should not be construed as limited to the embodiments set forth herein. It will be understood by those skilled in the art that various changes in form and details may be made herein without departing from the spirit and scope of the invention as defined by the appended claims.

The invention claimed is:

1. A method of forming gate-all-around structures for FinFET devices including the following steps:

S01, providing a semiconductor substrate; forming a composite layer on the semiconductor substrate and patterning the composite layer; wherein, the composite layer comprises a dielectric layer, a buried gate layer and a barrier layer from bottom to top;

S02, forming a sidewall layer on four sides of the patterned composite layer, then forming an epitaxial layer surrounding the sidewall layer; planarizing the epitaxial layer so that a top surface of the barrier layer, a top surface of the sidewall layer and a top surface of the epitaxial layer are at the same level;

S03, removing the barrier layer; depositing a first high-k dielectric layer having the same thickness with the barrier layer;

S04, forming a fin layer; patterning the fin layer to expose the buried gate layer, so as to form a fin structure;

S05, forming a dielectric isolating layer on the epitaxial layer;

S06, forming a second high-k dielectric layer on sidewalls and a top surface of the fin structure;

S07, forming a second gate layer, patterning the second gate layer to form a gate structure traversing and surrounding the fin structure.

2. The method according to claim 1, wherein the step S03 comprises the following steps:

S031, removing the barrier layer by wet etching or dry etching;

S032, depositing the first high-k dielectric layer having the same thickness with the barrier layer;

S033, removing the first high-k dielectric layer on the sidewall layer and the epitaxial layer.

3. The method according to claim 1, wherein the step S07 comprises the following steps:

S071, forming a second gate layer, the second gate layer covers the fin structure;

S072, planarizing the second gate layer;

S073, etching the second gate layer by lithography and etching processes to form the gate structure.

4. The method according to claim 1, wherein the buried gate layer is connected with the second gate layer to wrap the fin structure.

5. The method according to claim 1, wherein, in the step S04, the fin layer is formed by a bonding process; the material of the fin layer is the same as the material of the semiconductor substrate.

6. The method according to claim 1, wherein the material of the buried gate layer and the second gate layer is doped polysilicon.

7. The method according to claim 1, wherein, in the step S01, the dielectric layer is silicon oxide, silicon nitride, or silicon oxynitride; the barrier layer is silicon nitride or silicon carbon nitride.

8. The method according to claim 1, wherein, in the step S02, the material of the epitaxial layer is the same as the material of the semiconductor substrate.

9. The method according to claim 1, wherein the material of the first high-k dielectric layer and the second high-k dielectric layer is hafnium oxide.

10. The method according to claim 1, wherein the fin structure in horizontal projection has a bar shape, a stripe shape or a rectangular shape.

* * * * *